United States Patent
Hoffmann et al.

(10) Patent No.: US 8,174,169 B2
(45) Date of Patent: May 8, 2012

(54) PIEZOELECTRIC TRANSFORMER

(75) Inventors: Christian Hoffmann, Deutschlandsberg (AT); Igor Kartashev, Deutschlandsberg (AT)

(73) Assignee: EPCOS AG, Munich (DE)

( * ) Notice: Subject to any disclaimer, the term of this patent is extended or adjusted under 35 U.S.C. 154(b) by 92 days.

(21) Appl. No.: 12/427,134

(22) Filed: Apr. 21, 2009

(65) Prior Publication Data

US 2009/0236948 A1    Sep. 24, 2009

Related U.S. Application Data

(63) Continuation of application No. PCT/DE2007/001871, filed on Oct. 19, 2007.

(30) Foreign Application Priority Data

Oct. 23, 2006   (DE) .......................... 10 2006 049 919

(51) Int. Cl.
*H01L 41/08* (2006.01)

(52) U.S. Cl. ........................................ 310/359; 310/366

(58) Field of Classification Search .................. 310/325, 310/358, 359, 311, 366, 369, 367; *H01I 41/09*
See application file for complete search history.

(56) References Cited

U.S. PATENT DOCUMENTS

| 5,278,471 | A |   | 1/1994  | Uehara et al. |
|-----------|---|---|---------|---------------|
| 5,371,430 | A | * | 12/1994 | Sato et al. ...................... 310/359 |
| 5,440,195 | A | * | 8/1995  | Ohnishi et al. ................ 310/359 |
| 5,814,922 | A | * | 9/1998  | Uchino et al. ................ 310/359 |
| 6,008,565 | A |   | 12/1999 | Inoi et al. |
| 6,346,763 | B1|   | 2/2002  | Moon |

FOREIGN PATENT DOCUMENTS

| JP | 04-167504   | 6/1992  |
| JP | 04-338685   | 11/1992 |
| JP | 07-176804   | 7/1995  |
| JP | 2000-091660 | 3/2000  |
| JP | 2000-353833 | 12/2000 |
| JP | 2001-060730 | 3/2001  |

\* cited by examiner

*Primary Examiner* — Thomas Dougherty
*Assistant Examiner* — Karen B Addison
(74) *Attorney, Agent, or Firm* — Slater & Matsil, L.L.P.

(57) ABSTRACT

A piezoelectric transformer with a body that includes a first functional part and a second functional part is disclosed. The second functional part has inner electrodes, located in the body, which are connected to outer electrodes of this part. The first outer electrode of the first functional part is arranged parallel to the inner electrodes of the second functional part, wherein the minimum distance between the first outer electrode of the first functional part and the respective outer electrodes of the second functional part is selected greater than the distance between the first outer electrode of the first functional part and a terminal inner electrode of the second functional part facing it.

12 Claims, 2 Drawing Sheets

PIEZOELECTRIC TRANSFORMER

This application is a continuation of co-pending International Application No. PCT/DE2007/001871, filed Oct. 19, 2007, which designated the United States and was not published in English, and which claims priority to German Application No. 10 2006 049 919.0 filed Oct. 23, 2006, both of which applications are incorporated herein by reference.

BACKGROUND

A piezoelectric transformer is known from U.S. Pat. No. 6,346,763 B1 and Japanese patent publication JP 2001-060730 A.

SUMMARY

In one aspect, a disruptive discharge-resistant piezoelectric transformer is provided.

A piezoelectric transformer with a body comprises a first and a second functional part. Each functional part has outer electrodes, which are arranged on the surface of the body. The first part is, for example, an output part of the transformer, and the second part, an input part, or vice-versa. The functional parts are, for example, connected mechanically to one another by means of an insulating part.

An electrical alternating voltage is applied on the input part. There, it brings about mechanical deformations as a result of a piezoelectric effect. The deformations produce a potential difference between the electrodes of the outer part. An output voltage is measured from the output part, which perhaps differs from the input voltage by a transformation factor dependent on the structure of the transformer.

The second functional part has inner electrodes arranged in the body; they are connected to outer electrodes of this part. A first outer electrode of the first functional part is arranged parallel to the inner electrodes of the second functional part. The minimum distance between the first outer electrode of the first functional part and the respective outer electrode of the second functional part is selected larger than the distance between the first outer electrode of the first functional part and a terminal inner electrode of the second functional part facing it.

The distance between the outer electrodes of the two functional parts is therefore selected particularly large, wherein a leakage path on the surface, which is decisive for an electric disruptive discharge, is also enlarged in comparison to a minimum distance between conductive structures of the two transformer parts. This makes it possible to attain a high disruptive discharge resistance with a small design for the transformer.

The body comprises a large number of dielectric layers, which preferably contain ceramics. The dielectric layers exhibit piezoelectric characteristics. An inner electrode is located (in the second function part) between dielectric layers. In the first functional part, successive dielectric layers form a dielectric layer composite, which is located between the outer electrodes of this functional part. This layer composite preferably does not comprise inner electrodes.

The first functional part is preferably enclosed by the second functional part.

In both functional parts, acoustic vibrations can be excited in a lateral plane, that is, parallel to the electrode of the functional parts.

The first outer electrode of the first functional part in one embodiment is located on a first main surface of the body. The first functional part has a second outer electrode, which is preferably located on a second main surface of the body. The minimum distance between the second outer electrode of the first functional part and the respective outer electrode of the second functional part is selected larger than the distance between the second outer electrode of the first functional part and a terminal inner electrode of the second functional part facing it.

The outer electrodes of the second functional part are preferably, at least partially, located on side surfaces of the body. They are preferably limited on the side surface of the body. In this case, the distance between the first outer electrode of the first functional part and the respective outer electrode of the second functional part is particularly large.

Alternatively, at least one of the outer electrodes of the second functional part can have at least one area that goes beyond the edges of the side surfaces of the body, that is, is located in the boundary area of a main surface of the body.

In one embodiment, the functional parts have a common outer electrode, which is located at least partially on a second main surface of the body.

In one advantageous embodiment, the inner electrodes of the second functional part have, at least in one area, lying opposite the first outer electrode of the first functional part, a recess or an opening. In one embodiment, at least one outer electrode of the first functional part does not overlap with any of the inner electrodes of the second functional part.

The terminal inner electrode of the second functional part, facing the first outer electrode of the first part, can be provided as a ground electrode. The terminal inner electrode can, alternatively, be a signal electrode.

The inner electrodes of the second functional part comprise first and second inner electrodes, wherein, for example, second electrodes are connected to ground. Each of the second inner electrodes has an opening, which is preferably smaller than an opening of the first inner electrodes lying opposite it. The openings of the first and second inner electrodes can alternatively be selected equal.

The body preferably comprises an electrically insulating terminal layer, on which the first outer electrode of the first functional part is located. The terminal layer preferably covers terminal electrodes of the second functional part.

In one embodiment, the terminal layer is designed thinner than a layer that is located between two successive inner electrodes of the second functional part with a different polarity.

In one embodiment, the terminal layer exhibits piezoelectric characteristics. In this case, this layer can be used for the enlargement of an active volume of the first functional part, relevant for the transformation of the electromechanical energy.

An electrically insulating but nonpiezoelectric terminal layer can be considered. The material of the terminal layer is thereby different from the material of the other dielectric layers of the body. For example, a glass-containing or $SiO_2$-containing terminal layer is advantageous.

The material of the terminal layer can be, alternately, selected the same as with the other dielectric layers.

In one embodiment, the first functional part comprises an inner electrode, which is opposite the first outer electrode of this part and is connected conductively to it via a through-connection located in the terminal layer. The terminal layer is located between the inner electrode and the first outer electrode of the first functional part.

In principle, the body can have an arbitrary cross-section, for example, a round, oval, square, rectangular, or polygonal cross-section.

BRIEF DESCRIPTION OF THE DRAWINGS

The piezoelectric transformer will be explained now with the aid of schematic and not true-to-scale figures. The figures show the following.

Figure 1:
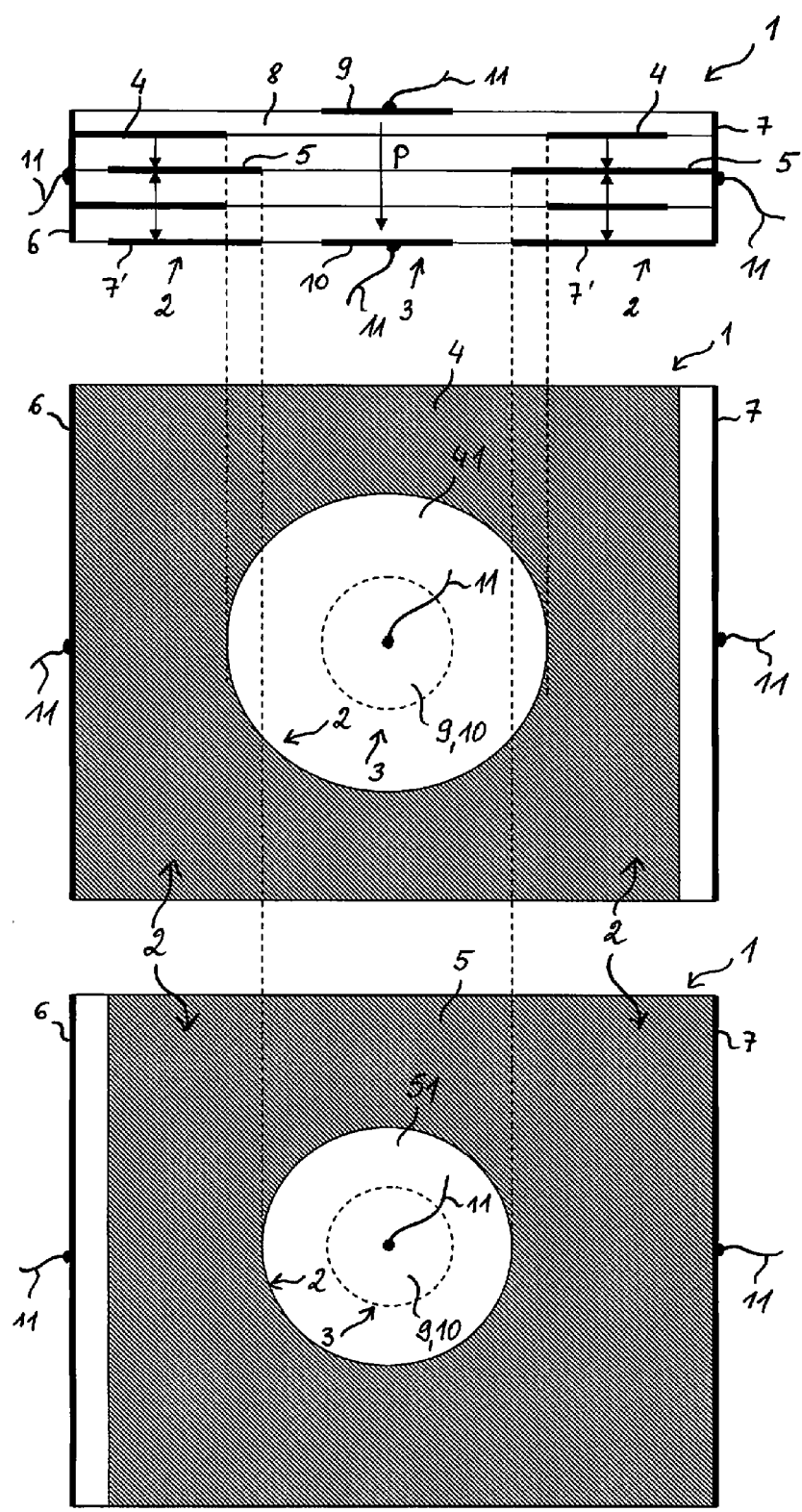
FIG. 1, shows various views of a first transformer with a terminal layer, on which the outer electrode of the first functional part is located.

The following list of reference symbols may be used in conjunction with the drawings:

1 Body
2 Second functional part
3 First functional part
4 First inner electrode
41 Opening
5 Second inner electrode
51 Opening
6, 7 Outer electrodes of the second functional part 2
6', 7' Areas of the outer electrodes 6, 7 lying on the main surface of the body 1
8 Terminal layer
9, 10 Outer electrodes of the first functional part 3
9', 10' Inner electrodes of the first functional part 3
11 Connecting wire
P Polarization direction of the piezoelectric layer

DETAILED DESCRIPTION

FIG. 1 shows a piezoelectric transformer in cross-section (above) and a top view of a first and second metallization plane (in the middle and below).

The piezoelectric transformer has a body 1, which comprises a first functional part 3, circular in cross-section, and a second functional part 2. The second functional part 2 surrounds, in the form of a ring, the first functional part 3.

The first functional part 3 has outer electrodes 9, 10, and the second functional part 2, outer electrodes 6, 7. The first outer electrode 9 of the first functional part 3 is located on the upper main surface and the second outer electrode 10 of the first functional part 3 on the lower main surface. The outer electrodes 6, 7 are located on side surfaces of the body 1, lying opposite one another. The outer electrode 7 has an area 7' that is located on the lower main surface and that has essentially the same design as the second inner electrodes 5 of the second functional part 2.

The outer electrodes 6, 7, 9, 10 are respectively connected to a connecting wire 11. The connecting wires can be soldered on or pressed onto the outer electrodes. Other types of connection are also possible.

The body comprises several piezoelectric layers, between which first and second metallization planes are alternatingly located. The polarization direction P of the respective piezoelectric layer or the composite of the piezoelectric layers is marked with arrows.

A first inner electrode 4 of the second functional part 2 is formed in the respective first metallization plane, and a second inner electrode 5 of the second functional part 2 is formed in the respective second metallization plane. The inner electrodes 4, 5 have different polarities.

The first inner electrodes 4 are each connected conductively to the first outer electrode 6 of the second functional part 2 and at a distance from the second outer electrode 7 of this functional part. The second inner electrodes 5 are each connected conductively to the second outer electrode 7 of the second functional part 2 and at a distance from the first outer electrode 6 of this functional part.

The distance between the upper outer electrode 9 of the first functional part 3 and the respective outer electrodes 6, 7 of the second functional part 2 is greater than that between the outer electrode 9 and the uppermost inner electrode 4 of the second functional part 2.

Each first inner electrode 4 has an opening 41 and each second inner electrode 5, an opening 51 (which is somewhat smaller in the embodiment according to FIG. 1).

The body 1 comprises a terminal dielectric layer 8 that completely covers the terminal (uppermost) inner electrode 4 of the second functional part 2. The layer 8 has a smaller thickness than the respective piezoelectric layer, which is located between two inner electrodes 4, 5.

The first outer electrode 9 of the first functional part 3 is located on the upper side of the terminal layer 8.

Figure 2:
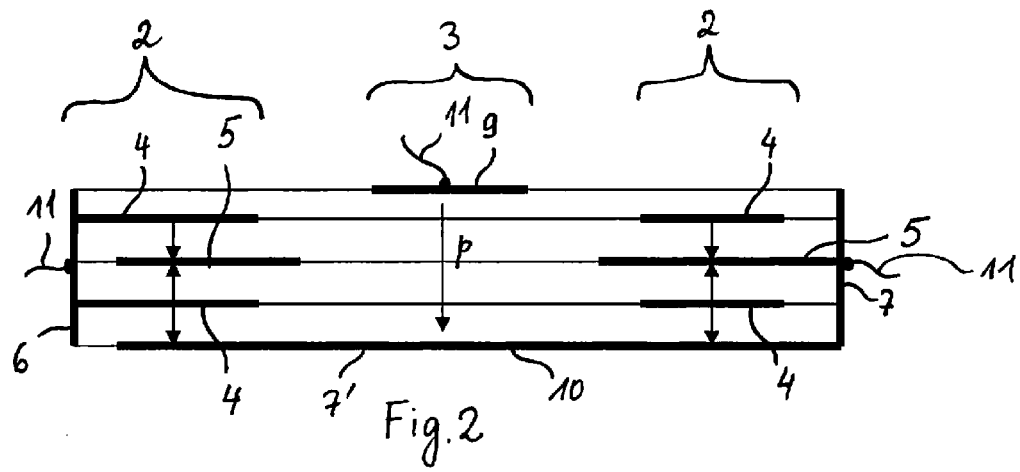
FIG. 2, shows in cross-section, a transformer, whose functional parts have a common outer electrode.
Figure 3:
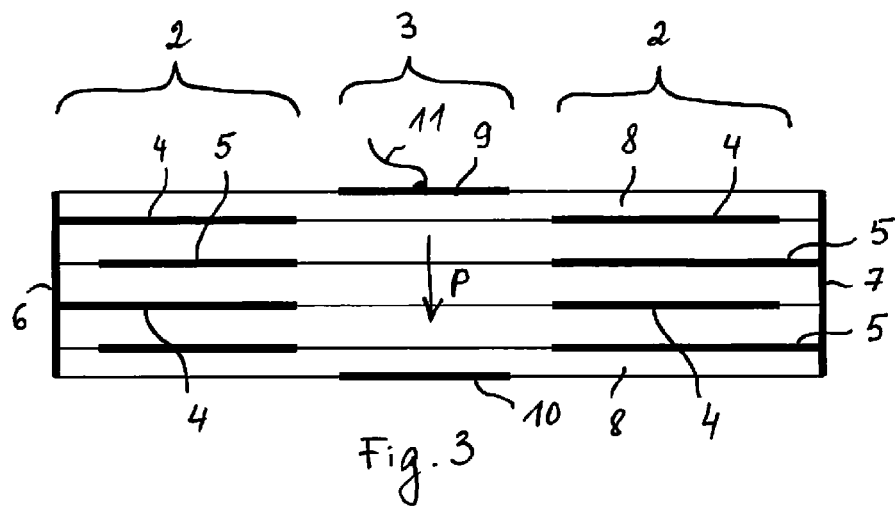
FIG. 3, shows in cross-section, a transformer, in which the outer electrodes of the second functional part are limited to the side surface.
Figure 4:
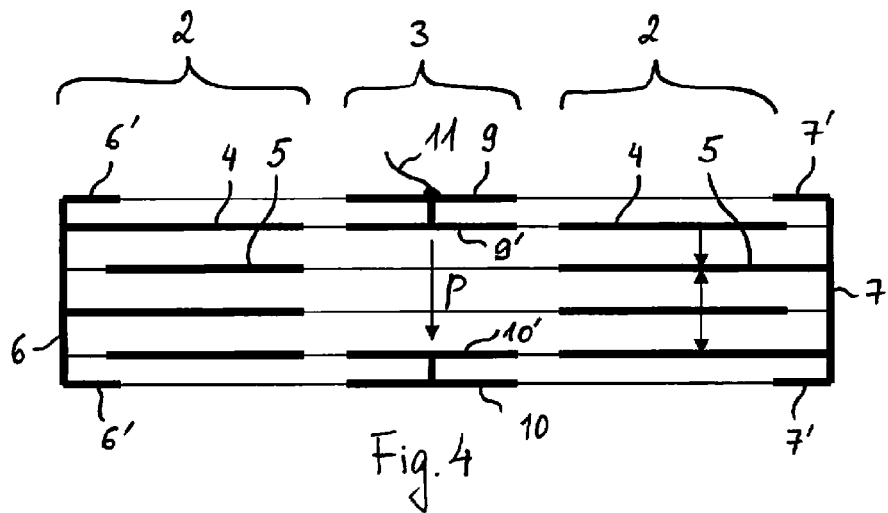
FIG. 4, shows in cross-section, a transformer, in which the outer electrodes of the first functional part is conductively connected to an inner electrode covered by the respective terminal layer.

In FIGS. 2-4, other possible embodiments of the indicated piezoelectric transformer are explained.

In the embodiment according to FIG. 2, both functional parts 2, 3 of the transformer have a common outer electrode 10, which is located on the lower main surface of the body 1. In this case, an electric connection is implemented between the outer electrodes 7 and 10 of the two functional parts on the surface of the body 1. It is also possible to externally connect the outer electrodes 7, 10 (see FIG. 1), which are not connected to one another originally—that is, to connect them conductively with one another outside the body 1.

In the embodiment according to FIG. 3, another terminal, dielectric layer 8, is provided, which covers the lowermost inner electrode 5 of the second functional part 2. The second outer electrode 10 of the first functional part 3 is located on the underside of the lower terminal layer 8. The distance between the lower outer electrode 10 of the first functional part 3 and the respective outer electrode 6, 7 of the second functional part 2 is greater than that between the outer electrode 10 and the lowermost inner electrode 5 of the second functional part 2. For the distance between the upper outer electrode 9 of the first functional part 3 and the respective outer electrode 6, 7 of the second functional part 2, the description of FIG. 1 is valid.

In the embodiment according to FIG. 4, an inner electrode 9', conductively connected to the first outer electrode 9, and an inner electrode 10', conductively connected to the second outer electrode 10, are provided in the first functional part 3. For the purpose of the electrical connection of the outer electrode 9, 10 and the inner electrode 9', 10', the respective terminal layer 8 has a through-contact.

The outer electrodes 6, 7 mainly located on the lateral surface of the body 1, has areas 6', 7', located in the edge area of the upper and lower main surfaces.

What is claimed is:
1. A piezoelectric transformer comprising:
a body, which comprises a first functional part and a second functional part;
wherein each functional part has outer electrodes, which are located on a surface of the body, wherein a first outer electrode of the first functional part is located on a first main surface of the body;

wherein the outer electrodes of the second functional part are located on lateral surfaces of the body that are different than the first main surface;

wherein the second functional part has inner electrodes, which are located in the body and which are connected to the outer electrodes of the second functional part;

wherein the first outer electrode of the first functional part is arranged parallel to the inner electrodes of the second functional part; and wherein a minimum distance between the first outer electrode of the first functional part and the outer electrode of the second functional part is greater than a distance between the first outer electrode of the first functional part and a terminal inner electrode of the second functional part facing it.

2. The piezoelectric transformer according to claim 1, wherein vibrations can be excited in a lateral plane in both functional parts.

3. The piezoelectric transformer according to claim 1, wherein the outer electrodes of the second functional part are limited to the lateral surfaces of the body.

4. The piezoelectric transformer according to claim 1, wherein at least one of the outer electrodes of the second functional part has at least one area that goes beyond edges of the lateral surfaces of the body.

5. The piezoelectric transformer according to claim 1, wherein the first and second functional parts have a common outer electrode that is located partially on a second main surface of the body.

6. The piezoelectric transformer according to claim 1, wherein the first functional part has a second outer electrode that is located on a second main surface of the body;

wherein a minimum distance between the second outer electrode of the first functional part and the outer electrode of the second functional part is greater than a distance between the second outer electrode of the first functional part and a terminal inner electrode of the second functional part facing it.

7. The piezoelectric transformer according to claim 1, wherein the inner electrodes of the second functional part have a recess at least in one area opposite the first outer electrode of the first functional part.

8. The piezoelectric transformer according to claim 1, wherein the body comprises a terminal dielectric layer, on which the first outer electrode of the first functional part is located; and wherein the terminal dielectric layer covers terminal electrodes of the second functional part.

9. The piezoelectric transformer according to claim 8, wherein the terminal dielectric layer is thinner than a layer that is located between two successive inner electrodes with different polarities.

10. The piezoelectric transformer according to claim 8, wherein the terminal dielectric layer comprises a material that differs from all other dielectric layers of the body.

11. The piezoelectric transformer according to claim 8, wherein the first functional part comprises an inner electrode, covered by the terminal dielectric layer, the inner electrode standing opposite the first outer electrode of the first functional part and being connected conductively to it.

12. The piezoelectric transformer according to claim 1, wherein the first functional part is surrounded by the second functional part.

* * * * *